United States Patent
Boerner et al.

(10) Patent No.: US 9,392,649 B2
(45) Date of Patent: Jul. 12, 2016

(54) ORGANIC ELECTROLUMINESCENCE DEVICE WITH SEPARATING FOIL

(75) Inventors: Herbert Friedrich Boerner, Aachen (DE); Rainald Manfred Gierth, Cologne (DE); Stefan Peter Grabowski, Neuss (DE); Petrus Cornelis Paulus Bouten, Eindhoven (NL); Peter Van de Weijer, Heeze (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/805,172

(22) PCT Filed: Jun. 15, 2011

(86) PCT No.: PCT/IB2011/052591
§ 371 (c)(1),
(2), (4) Date: Dec. 18, 2012

(87) PCT Pub. No.: WO2011/161586
PCT Pub. Date: Dec. 29, 2011

(65) Prior Publication Data
US 2013/0093315 A1     Apr. 18, 2013

(30) Foreign Application Priority Data

Jun. 22, 2010   (EP) .................................... 10166885
Sep. 24, 2010   (EP) .................................... 10179138

(51) Int. Cl.
*H01L 51/52*    (2006.01)
*H05B 33/04*    (2006.01)
*H05B 33/14*    (2006.01)

(52) U.S. Cl.
CPC .............. *H05B 33/04* (2013.01); *H01L 51/524* (2013.01); *H01L 51/5259* (2013.01); *H05B 33/14* (2013.01); *H01L 51/525* (2013.01); *H01L 2251/55* (2013.01)

(58) Field of Classification Search
CPC ........................... H05B 33/04; H01L 51/5237
USPC ................................................... 313/498–512
See application file for complete search history.

(56) References Cited

U.S. PATENT DOCUMENTS

| | | | |
|---|---|---|---|
| 6,111,355 A * | 8/2000 | Inoue et al. | .......... 313/506 |
| 6,835,953 B2 | 12/2004 | Cok | |
| 6,882,104 B2 | 4/2005 | Miwa | |
| 2002/0149035 A1 | 10/2002 | Yamada | |

(Continued)

FOREIGN PATENT DOCUMENTS

| | | | |
|---|---|---|---|
| JP | 2002231441 A | 8/2002 |
| JP | 2009181887 A | 8/2009 |

(Continued)

OTHER PUBLICATIONS

Machine translation of JP11-162634.*

*Primary Examiner* — Elmito Breval
*Assistant Examiner* — Zachary J Snyder

(57) ABSTRACT

An organic electroluminescence device (OLED) has a substrate, a first electrode layer, a layer of organic electroluminescence material, a second electrode layer, a cover layer, a moisture-absorber and a separating foil of resilient material. The separating foil is positioned between the second electrode layer and the moisture-absorber. Spacer structures such as dots are applied on the separating foil between the foil and the cover.

16 Claims, 3 Drawing Sheets

(56) References Cited

U.S. PATENT DOCUMENTS

| | | |
|---|---|---|
| 2002/0172839 A1 | 11/2002 | Van Hal |
| 2003/0038590 A1 | 2/2003 | Silvernail |
| 2003/0190763 A1* | 10/2003 | Cok et al. .................. 438/22 |
| 2004/0075115 A1 | 4/2004 | Fery |
| 2005/0036090 A1* | 2/2005 | Hayashi et al. ............ 349/122 |
| 2005/0241483 A1 | 11/2005 | Okada |
| 2005/0255782 A1* | 11/2005 | Park et al. .................. 445/25 |
| 2006/0145603 A1* | 7/2006 | Taniguchi et al. ............ 313/506 |
| 2007/0137781 A1 | 6/2007 | Huang |
| 2007/0278950 A1* | 12/2007 | Hu ................. H01L 51/5237 313/512 |
| 2008/0150419 A1* | 6/2008 | Kang ........................ 313/504 |
| 2008/0203909 A1* | 8/2008 | Azuma ...................... 313/504 |
| 2008/0224601 A1* | 9/2008 | Frischknecht ...... H01L 51/5237 313/504 |
| 2008/0265753 A1* | 10/2008 | Ricks et al. .................. 313/504 |
| 2009/0026945 A1 | 1/2009 | Boroson |
| 2009/0130941 A1 | 5/2009 | Boroson |

FOREIGN PATENT DOCUMENTS

| | | |
|---|---|---|
| WO | 2006057492 A1 | 6/2006 |
| WO | 2008132671 A2 | 11/2008 |
| WO | 2008144080 A1 | 11/2008 |
| WO | 2009086095 A2 | 7/2009 |
| WO | 2009096537 A1 | 8/2009 |
| WO | 2010020792 A1 | 2/2010 |

* cited by examiner

ORGANIC ELECTROLUMINESCENCE DEVICE WITH SEPARATING FOIL

FIELD OF THE INVENTION

The invention relates to the field of organic electroluminescence devices, comprising a substrate, a first electrode layer, a layer of organic electroluminescence material, a second electrode layer, moisture-absorbing means, a separating foil and a cover layer. Such devices are commonly referred to as OLEDs.

BACKGROUND OF THE INVENTION

Such a device is known from patent publication US 2008/0265753-A1. This document describes typical OLEDs having a substrate, a first electrode layer being deposited directly on the substrate, an electroluminescence layer (EL) and a second electrode layer being deposited on the EL. Said EL is composed of different sublayers, including an emission layer and a conductive layer. Upon applying a voltage in the range of 2-10 V between both electrode layers, the EL emits light. Depending on the type of the electroluminescence materials used in the EL, different light spectrums (colors) can be generated with OLEDs. At least one of the two electrode layers is transparent for light generated by the EL. The described layer package is contained in a cavity formed by a bowl-like cover layer. Said cover is secured at its rim to the glass substrate by means of a sealing material.

The known OLED also comprises moisture-absorbing means positioned at different locations in the cavity, like inside the sealing material, on the second electrode layer and on the inner surface of the cover layer. These moisture-absorbing means function as a getter for chemically or physically removing moisture from the inside of the OLED. Said moisture-absorbing means may comprise water-absorbing materials like metaloxide particles (f.e. CaO) being bound in a matrix of an organic polymer. In OLEDs, the anode/EL/cathode package is known to be extremely sensitive to moisture. Therefore, the presence of moisture-absorbing means has been shown to be essential in enhancing the life-span of OLEDs. If possible, the level of moisture should remain below 1000 ppm.

The described OLED further comprises a separating foil, which is positioned between the cover layer and the moisture-absorbing means which is deposited on the second electrode layer. Said separating foil acts as a compliant protection layer which should prevent direct contact between the cover and the EL. Such contact can cause mechanical damage to one the electrodes or shorting. In the described OLED, mechanical stresses due to flexing are absorbed by the separating foil of resilient material.

The here-described OLED is of the so-called 'cavity-lid' type, in which the EL is contained in a bowl-like cover. In principle, light generated by the EL exits the OLEDs of the cavity-lid type only via the substrate. Therefore, both the substrate and the first electrode layer deposited on it are transparent to the light generated by the EL. Often the substrate is made of glass, the first electrode layer of ITO (Indium Tin Oxide, or InSnO) and the second electrode of a thin layer of Al. The cover can be made of glass or metal. Another type of OLEDs is commonly referred to as the 'flat-lid' type. In this type, the mentioned layer package of the EL is sandwiched between the first and second electrode layers. Latter layers are covered on both main surfaces by flat substrates. In this OLED type, both substrates and both electrode layers can be more or less transparent for the light generated by the EL. In OLEDs of the flat-lid type, the substrate and the cover are often made of glass whereas the first electrode is made of ITO and the second electrode can be formed as a thin layer of Al.

It has been experienced that the known OLED shows certain drawbacks. It has appeared that, also in the absence of any mechanical pressures on their substrates, the known OLEDs show too many failures. This is especially observed during so-called 'drop tests', in which the OLEDs are dropped from a limited height (f.e. 1 meter) on the floor. Under these circumstances, the EL stops emitting light under appropriate voltages. As a consequence, the current mean life-span of the known OLEDs is considered to be still insufficient.

SUMMARY OF THE INVENTION

It is an object of the invention to overcome or at least mitigate these or other drawbacks of the known OLEDs. More particularly, the present invention aims at providing an OLED, in which the mean life-time is enhanced.

This and/or other objects are achieved by an organic electroluminescence device, comprising 1) a substrate on which a first electrode layer is provided, 2) a layer of organic electroluminescence material being provided on the first electrode layer, 3) a second electrode layer being provided on the layer of electroluminescence material, 4) a cover layer being positioned on the side of the second electrode layer that faces away from the layer of electroluminescence material, 5) moisture-absorbing means and 6) a separating foil of resilient material being positioned between the second electrode layer and the moisture-absorbing means.

The invention is amongst others based on the insight acquired by the inventors, that direct contact between the moisture-absorbing means and the second electrode layer causes chemical damage of said electrode, which on the long term results in destruction of the OLED. Said chemical damage is caused by reactive chemicals which are mainly responsible for capturing moisture in the moisture-absorbing means. If the electrode layer does not fully cover the EL, even reaction between the moisture-absorbing material and the EL can occur. This also can result in failure of the OLED. Therefor, the separating foil preferably covers the whole surface of the second electrode. If the second electrode does not fully cover the surface of the EL, it is also preferred that the separating foil covers also the surface parts of the EL which are not covered by the electrode layer.

It has also been realized that within the gas-filled volume of the OLED, particles can be present. These particles can have various sources. They can be getter and/or binder particles which are released from the moisture-absorbing means, glass particles released from the glass substrate, debris already present on the unfinished OLED product or dirt originating from equipment for manufacturing the OLED. In principle, these particles are capable to damage the layer stack of the EL and the electrode layers.

In the invented OLED, no moisture-absorbing means are present between the separating foil and the second electrode layer. So, no chemical reactions of moisture-absorbing material with the electrode layer material can occur. Such reaction can result in corrosion of the electrode layer, especially if the electrode layer is of Al. In view of this, it goes without saying that the separating foil is free of reactive chemicals, such as inorganic metal oxides (CaO, MgO, BaO, etc). The foil also prevents mechanical damage caused by particles of any source available in the OLED. In order to allow the foil to absorb mechanical stresses, for example caused by flexing, the material of the foil should be resilient. Materials having a Young's modulus (Ym) of 1 GPa or less can be used in these foils with great satisfaction. Foils having a Ym above 1 GPa show hardly any mechanical protection effect when present in OLEDs. Best results are obtained with foil materials having a Ym between 0.2 GPa and 0.8 GPa.

In a preferred embodiment of the OLED according to the invention, the separating foil is made of an organic resin material. These materials can easily and at low cost be manufactured with the required properties, like electrical resistance, impermeability to water, etc. A large scale of (modified) natural and synthetic organic resin materials can be used. Regarding synthetic resin materials, both thermoplastic and thermosetting polymers can be used. It is further stressed that not only homopolymers but also copolymers and block-copolymers can be applied as material for the separating foil. It is stressed that the foil contains only organic resin material without any inorganic additives.

Another preferred embodiment of the OLED according to the present invention is characterized in that the organic resin material is a polyolefin material. It has been found that this class of organic materials show very attractive properties, like the elasticity, electrical resistance and impermeability for moisture, which makes them particularly suitable for use as separating foil in the invented OLED. Typical examples of this class of materials are polypropene and polyisobutene. The best results are however obtained with (modified) poly-ethene (0.2 GPa<Ym<0.8 GPa), such as pure polyethene or polyvinilydenefluoride (Ym appr. 0.5 GPa).

A further interesting embodiment of the invented OLED has the feature that the organic resin material is a Si-containing polymer. Separating foils of this material are very resilient and can therefor absorb rather large mechanical stresses without failure of the OLED. These foils are also extremely inert towards chemically reactive materials.

Interesting is also the embodiment of the invented OLED in which the resin material of the separating foil is a foam material. The material of such foil has a porous structure. This has the advantage that moisture can diffuse through these foils. So, undesired moisture present between the electrode layer and the foil can now diffuse through the foil in the direction of the moisture-absorbing means, by which it is captured.

Another embodiment of the invented OLED has the feature that the thickness of the foil is between 2 and 500 micrometer. Experiments and calculations with different types of foils have shown that the thickness of the foil should not be less than 2 micrometer. In that case, hardly any stress-absorbing effect of the foil is observed anymore. The thickness of the foil should however also not be more than 500 micrometer. In that case, the foil becomes too thick to be incorporated in the usual cavity-lid OLEDs. An optimal compromise between both negative effects is obtained in case that the invented OLED comprises a separating foil having a thickness between 10 and 50 micrometer.

Great interest is also shown for an embodiment of the invented OLED which shows the feature that the moisture-absorbing means are provided on the surface of the foil, which faces away from the EL. OLEDs with this feature can be simpler manufactured, as separating foil and moisture-absorbing means can be introduced in the cavity in a single handling.

Especially attractive is the embodiment of the OLED according to the present invention wherein the separating foil is provided on the second electrode layer and wherein the separating foil has spacer structures on the surface of the separating foil which faces away from the second electrode layer. In larger area OLEDs, the separating foil acts as a spacer layer, which, together with the layer of moisture-absorbing means, significantly occupies the space between the cover layer and the second electrode layer. In these circumstances, moisture entering the OLED cell via the sealing material cannot distribute over the whole free surface of the moisture-absorbing layer, but will react in first instance only at the outer rims of said layer. While completely saturating the rims area, the moisture will be able to degrade the second electrode layer and the EL, thus causing discolored area at the rims of the OLED lighting area.

In the OLED according to the present embodiment, the spacer structures arrange for a free space between the separating foil and the cover layer. Therefore incoming moisture can penetrate in this free space and react with the layer of moisture-absorbing means which is present between the separating foil and the cover layer. So, saturation of the absorbing means by the moisture will take place over the whole layer, not only at rim portions of the layer. As a result, the first visible features of cell degradation will be significantly delayed. This increases the mean life-span of such large area OLEDs. The spacer structures should be on the surface of the separating foil which faces away from the second electrode layer (i.e. in the direction of the cover layer), as the moisture-absorbing means are present between the separating foil and the cover layer.

Another embodiment of the OLED according to the invention shows the feature that the spacer structures comprise a series of protruding dots. These dots define a space between the cover layer and the separating foil. Although the dots in practice will be applied in regular pattern on the separating foil, irregular patterns will also function. The shape of the dots is also less important. Seen along the normal to the plane of the separating foil, the dots can have for instance a rectangular or a square form. In view of ease of application, dots having a circular or elliptic form are preferred.

Interesting is also the embodiment of the invented OLED in which the spacer structures comprise a cured adhesive material. When using such material for the spacer structures, the separating foil and the cover layer can be firmly fixed to each other in an easy way. Such fixation improves the rigidity of the OLED. Use of such materials has also a clear advantage during the manufacture of the OLEDs in mass production. This material can be easily applied in dots on the separating foil. In a subsequent step, the separating foil and the cover layer can be attached by means of the spacer structures, which are formed by the dots of the adhesive material. Subsequently the adhesive material is cured.

The total surface area by which the spacer structures contact the cover layer is less than the total surface of the separating foil on which these structures are provided. Practice has shown that the ratio between these surfaces can be chosen in a wide range without going outside the scope of the present invention. The contact ratio is defined as the ratio of the total contact surface area of the spacer structures divided by the total surface area of the separating foil. Practice has shown that a contact ratio less than 1% does not function, because possible stresses built up between the cover layer and the separating foil cannot be absorbed by the spacer structures anymore. On the other hand, a ratio more than 50% causes the amount of readily accessible moisture-absorbing means becomes to become too little to provide effective moisture protection. An optimal compromise between both extremes is found when the contact ratio is in the range between 5% and 20%.

A further interesting embodiment of the invented OLED has the characteristic that the moisture-absorbing means are provided in a layer on the surface of the cover layer which faces towards the separating foil. The moisture-absorbing means can be provided in a continuous layer on the cover layer, so that in the finished OLED cell the spacer structures are in contact with the cover layer via the layer with moisture-absorbing means. In view of production techniques, the use of continuous layers is preferred over the use of discontinuous layers.

An interesting alternative embodiment of the invented OLED has the characteristic that the moisture-absorbing means are provided on the surface of the cover layer where the spacer structures do not contact the cover layer. In this embodiment, a non-continuous layer with moisture-absorbing means is applied on the cover layer. In finished OLED cells according to this embodiment, the attachment of the separation layer to the cover layer is independent of the change in physical properties of the moisture-absorbing means.

Most interesting is the embodiment of the invented OLED in which the moisture-absorbing means are incorporated in the spacer structures. In this embodiment the functions of both the spacer structures and the moisture-absorbing means are incorporated in a single structural element. From the view of production, such combination is interesting, as both functions can be applied in the OLED cell in a single handling step.

BRIEF DESCRIPTION OF THE DRAWINGS

These and other aspects of the invention will be apparent from and elucidated with reference to the embodiments described hereinafter.

In the drawings.

It is stressed that the drawing is schematic and not to scale. In the different Figures, same elements are denoted with the same reference numbers.

DETAILED DESCRIPTION OF EMBODIMENTS

Figure 1:
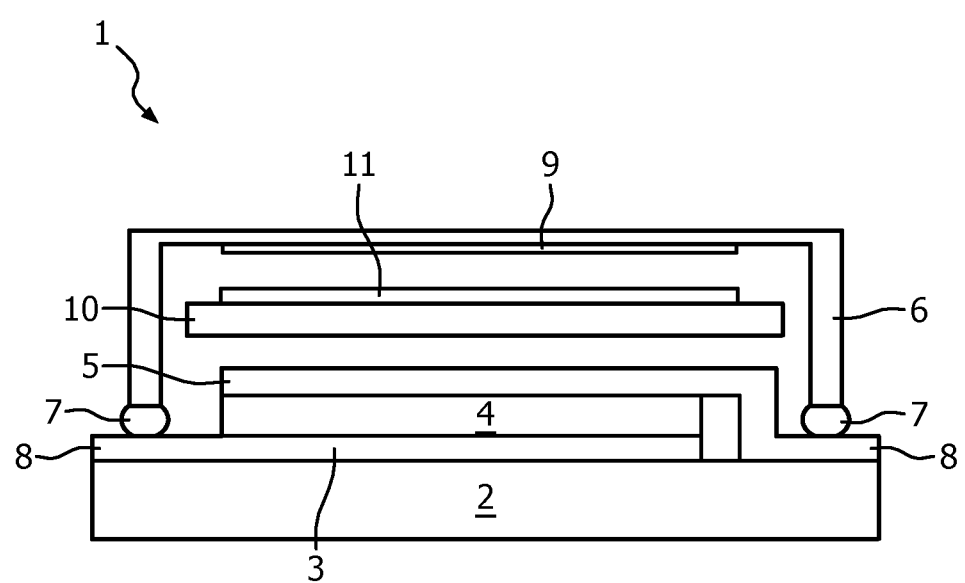
FIG. 1 shows the cross-section of a first embodiment of an OLED according to the present invention.

In FIG. 1, the cross-section of an OLED 1 (of the 'cavity-lid' type) according to the present invention is shown. It comprises a substrate 2 of glass on which a thin, first electrode layer 3 of ITO is sputtered (thickness appr 100 nm). On layer 3, an electroluminence layer 4 of well-known materials is applied by known techniques. The properties of the materials and the transparency window of the substrate 2 and the first electrode layer 3 are mutually tuned. EL 4 is composed of several sublayers, including a conduction layer and an emission layer. Additional layers like a hole blocking layer, an electron blocking layer may also be present in EL 4. On top of EL 4, a second electrode layer 5 of Al is provided by means of metal evaporation. Layer 5 has a thickness of appr 100 nm and fully covers the surface of EL 4.

The OLED also comprises a cover layer 6 of metal (here Al), which is attached along its rim to substrate 2 with a sealing material 7. Good results are obtained if a UV-setting glue is used. Electrical leads 8 being connected with the first electrode layer 3 and the second electrode layer 5 are routed through the sealing material 7 to the outside world. Applying a voltage of 2-10 Volts on these leads 8 will activate the EL 4, thereby giving rise to illumination. Moisture-absorption means 9 formed as layer of CaO particles fixed in a polymer matrix is attached to the inside of the bowl-formed cover layer 6. During the life of the OLED, moisture may most likely enter the cavity formed by the bowl-like cover layer 6 via the sealing material 7 by means of which it is attached to the substrate 2.

The OLED further comprises a separating foil 10 of resilient material. According to the invention, this foil 10 is positioned between the second electrode layer 5 and the moisture-absorbing layer 9 and lies loose in the cavity. This foil 10 fully covers the surface of the second electrode layer 5, and preferably is somewhat larger in its surface dimensions. In the present example, a sheet of Tyvak (polethylene spun bonded sheet with thickness of 20 nm, DuPont) was used. The Youngs modulus of this material is appr 0.3 GPa. Good results have also obtained with other foils made of other polyolefin materials. Especially good results were obtained with a foil of a Si-containing polymer material. The Young modulus of these materials was below 1 GPa.

In a comparative experiment, OLEDs according to the invention of the above-described design were compared with the same OLEDs in which moisture-absorption means formed als CaO containing layers 9 were present between the separating foil 10 and the second electrode layer 5 (so not according to the invention). In appeared that in the OLEDs of the second type (not according to the invention) showed more failures than the ones of the first type (according to the invention).

FIG. 1 also shows a second layer 11 of moisture-absorbing means. This layer 11 is provided on the surface of the foil 10, which faces away from the EL 4. In practice, having the moisture-absorption means formed as a layer 11 attached to the separating foil 10 presents a clear advantage during the manufacture of the invented OLED. An additional advantage is obtained in case that the organic resin material of the foil 10 is a foam material. Such material comprises pores through which moisture can be transported. In case that moisture is present between the foil 10 and the EL 4, it can be rather easily transported through the foil (10) to the moisture absorbing means, which are attached as layer 11 to the surface of the foil that faces away from the EL 4.

Figure 2:
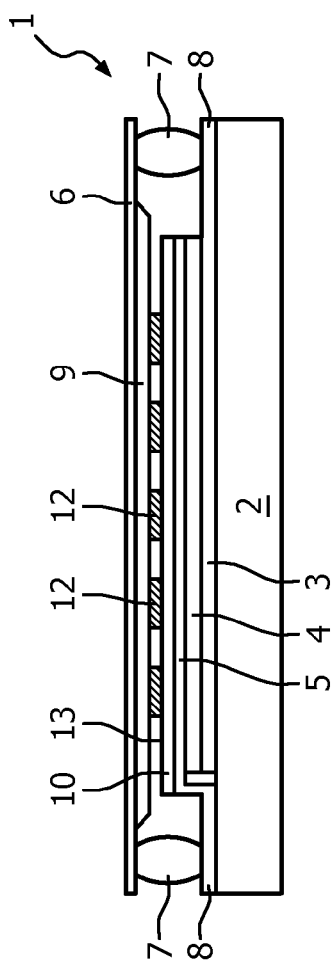
FIG. 2 shows the cross-section of a second embodiment of an OLED according to the present invention.

In FIG. 2, the cross-section of a second embodiment of an OLED 1 (of the 'flat-lid' type) according to the present invention is shown. It comprises a substrate 2 of glass (thickness appr 200 micrometer) on which a thin, first electrode layer 3 of ITO is sputtered (thickness appr 100 nm). On electrode layer 3, a layer package comprising well-known electroluminence materials (EL) 4 is applied by known techniques. The properties of the materials and the transparency window of the substrate 2 and the first electrode layer 3 are mutually tuned. EL 4 is composed of several sublayers, including a conduction layer and an emission layer. Additional layers like a hole blocking layer, an electron blocking layer may also be present in EL 4 as well. On top of EL 4, a second electrode layer 5 of Al is provided by means of metal evaporation. Electrode layer 5 has a thickness of appr 100 nm and it fully covers the surface of EL 4.

The OLED also comprises a thin cover layer 6 of metal (here steel), having a thickness of 100 micrometer. Most generally thicknesses of steel cover layers can range between 20 and 400 micrometers within the scope of the present invention. Said cover layer 6 is fixed along its rim to substrate 2 with a sealing material 7, like a (UV-curable) glue is used. Electrical leads 8 being connected with the first electrode layer 2 and the second electrode layer 4 are routed through the sealing material 7 to the outside world. Applying a electrical voltage in the range of 2-10 V between these leads 8 will activate the EL 4, thereby giving rise to illumination. Moisture-absorption means 9 formed as continuous layer comprising CaO particles fixed in a polymer matrix are attached to the inside surface of the flat cover layer 6. During the life of the OLED, moisture may most likely enter the OLED cell via the sealing material 7 by means of which the cover layer 6 it is attached to the substrate 2.

The OLED further comprises a separating foil 10 of polymer material. In this embodiment, separating foil 10 fully covers second electrode layer 5. In the present situation a UV-cured polymer layer comprising fluoride side-groups was used. The UV-cured polymer may be prepared from a mixture comprising (meth)acrylate and/or epoxy monomers. The thickness of the separation layer 9 was 200 micrometer. According to an aspect of the invention, the separating foil 10 comprises spacer structures 12 on its surface 13 that faces away from the second electrode layer 5. These spacer structures 12 are prepared of a cured adhesive material and have a thickness chosen in the range between 50 and 400 micrometers. The presence of spacer structures 12 arrange for space between cover layer 6 and separating foil 10. As will be shown in more detail in FIG. 5, spacer structures 12 are formed as protruding dots. In this second embodiment of the invented OLED, the spacer structures 12 are not fixed directly to cover layer 6, but are connected via a continuous layer in which moisture-absorbing means 9 are incorporated.

Figure 3:
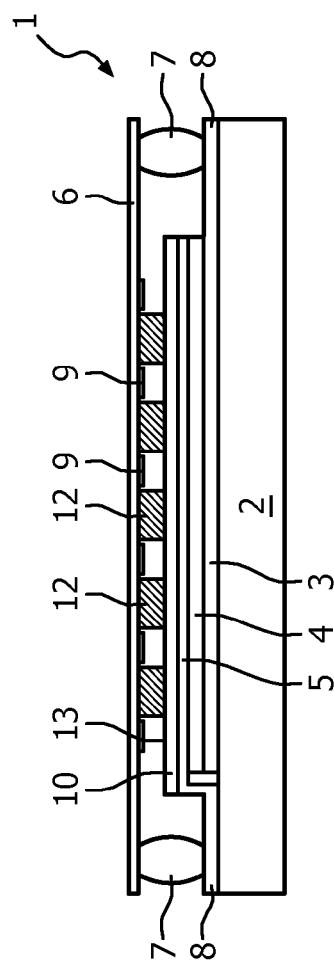
FIG. 3 shows the cross-section of a third embodiment of an OLED according to the present invention.

FIG. 3 shows a third embodiment of the invented OLED. This embodiment differs from the second embodiment in regard to moisture-absorbing means 9. In this third embodiment, these means are not applied in a continuous layer on the inside surface of the cover layer 6, but are only applied on cover layer 6 where the spacer structures 12 do not contact cover layer 6. This has the advantage that the distance determined by spacer structures 12 can be more precisely achieved, as these spacer structures are in direct contact with cover layer 6.

Figure 4:
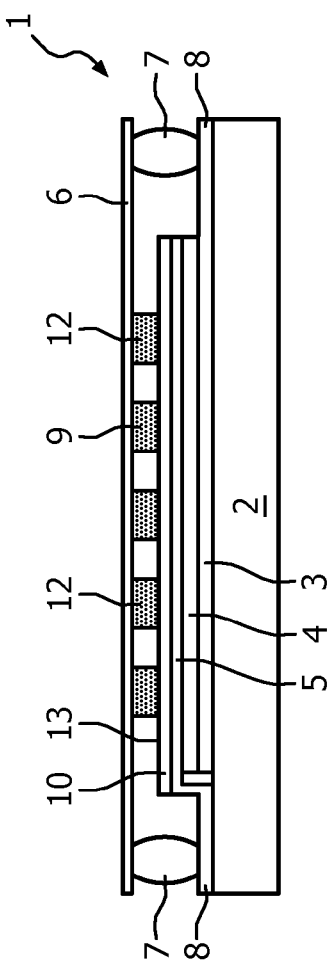
FIG. 4 shows the cross-section of a fourth embodiment of an OLED according to the present invention.

FIG. 4 shows a fourth embodiment of the invented OLED. In this embodiment, moisture-absorbing means 9 are incorporated into spacer structures 12. This embodiment shows production technical advantages, as moisture absorbing-means 9 and spacer structures 12 can be applied in the OLED cell in a single handling.

Figure 5:
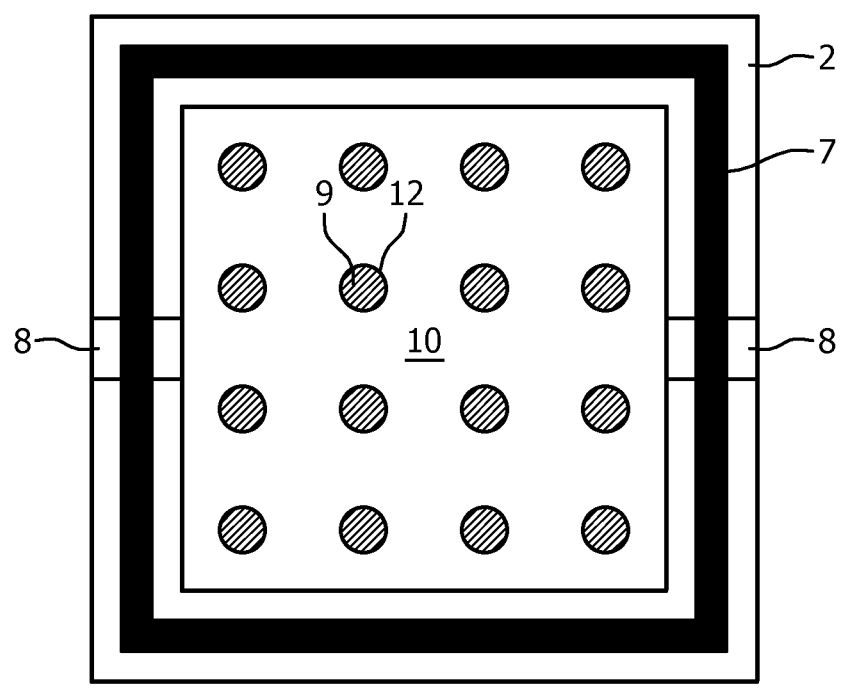
FIG. 5 shows a schematic top-view of the fourth embodiment of an OLED according to the present invention.

FIG. 5 shows a schematic first top-view of the fourth embodiment as depicted in FIG. 4. For reasons of clarity, the schematic top-view was made in the absence of cover layer 6. The OLED 1 comprises a substrate 2 on which a closed line of sealing material 7 is applied in square form around the anode/EL/cathode layer package. Opposite positioned electrical leads 8, being attached to the first and second electrode layers 3 and 5 (not shown) are indicated as well. On separating foil 10 a series of protruding spacer structures 10, formed as dots are applied. The contact ratio amount is approximately 8%. Moisture-absorbing means 9 are incorporated in spacer structures 12.

Several experiments have been performed in which the OLEDs according to the present invention been compared with prior art OLEDs, in particular with OLEDs comprising a separating foil without spacer structures. These prior art OLEDs showed in many cases discolored area at the rim of the lighting area after having worked for a certain test period. OLEDs according to the present invention did not show such discolored area after having worked the same test period. This confirms the expectations of the inventors.

The OLEDs according to the invention can be manufactured as follows. On a suitable substrate 2, preferably of glass, respectively a first electrode layer 3, a package of layers comprising organic electroluminescence material 4 and a second electrode layer 5 are deposited with well known deposition techniques. In a next step, a separating foil 10 with spacer structures 12 is positioned on and fixed to second electrode layer 5. This can be done either in a single step or in a series of steps. In the single step method, the separating foil 10 is already provided with spacer structures 12 before it is positioned on and fixed to second electrode layer 5. In the other method, separating foil 10 is applied on electrode layer 5 and spacer structures 12 are applied on separating foil 10 afterwards. In latter method, separating foil 10 can be produced 'in situ'. Thus, a curable polymer solution can be applied on electrode layer 5, which is subsequently cured into a separating foil 10. In this method, UV-curable solutions comprising (meth)acrylate and/or epoxy monomers can be used with great advantage in the 'in situ' preparation of separating foil 10. It is preferred to use fluor-containing components in the solution, which will arrange that separating foil 10 is impermeable for moisture. In a subsequent step, spacer structures 12 can be applied on the cured separating foil 10. It is preferred to use a curable adhesive for this purpose in order to fix separating foil 10 and cover layer 6 via curable spacer structures 12 in a permanent way.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An organic electroluminescence device comprising:
a substrate;
a first electrode layer formed on the substrate;
a layer of organic electroluminescence material formed on the first electrode layer;
a second electrode layer formed on the layer of organic electroluminescence material;
a cover layer being positioned on a side of the second electrode layer that faces away from the layer of organic electroluminescence material;
a moisture-absorbing layer; and
a separating foil of resilient material formed on a surface of the second electrode layer, said separating foil being positioned between the second electrode layer and the moisture-absorbing layer; and
a plurality of spacer structures, said plurality of spacer structures being positioned between the separating foil, and one of the moisture-absorbing layer and the cover layer,
wherein a first surface of the plurality of spacer structures is fixed on a surface of the separating foil which faces towards the moisture-absorbing layer,
wherein a second surface of the plurality of spacer structures is fixed on one of a surface of the moisture-absorbing layer which faces towards the separating foil and a surface of the cover layer which faces towards the separating foil, wherein the plurality of spacer structures are primarily composed of a cured adhesive material, and wherein a contact ratio is between 5% and 20%, the contact ratio being a total surface area of the separating foil covered by the plurality of spacer structures divided by a total surface area of the separating foil.

2. The organic electroluminescence device according to claim 1, wherein the separating foil is made of an organic resin material.

3. The organic electroluminescence device according to claim 2, wherein the organic resin material is a polyolefin material.

4. The organic electroluminescence device according to claim 3, wherein the polyolefin material is polyethylene or a modified polyethylene.

5. The organic electroluminescence device according to claim 2, wherein the organic resin material is a Si-containing polymer.

6. The organic electroluminescence device according to claim 1, wherein a thickness of the separating foil is between 310 and 500 micrometers.

7. The organic electroluminescence device according to claim 1, wherein the plurality of spacer structures comprises a series of protruding dots.

8. The organic electroluminescence device according to claim 1, wherein the moisture-absorbing layer is formed on a surface of the cover layer which faces towards the separating foil.

9. The organic electroluminescence device according to claim 8, wherein the moisture-absorbing layer is formed only on portions of the surface of the cover layer between the plurality of spacer structures where the plurality of spacer structures does not contact the cover layer, and wherein the second surface of the plurality of spacer structures is fixed on the surface of the cover layer.

10. The organic electroluminescence device according to claim 1, wherein the moisture-absorbing layer is incorporated in the spacer structures, and wherein the second surface of the plurality of spacer structures is fixed on the surface of the cover layer.

11. The organic electroluminescence device according to claim 3, wherein the polyolefin material is pure polyethene or polyvinylidenefluoride.

12. The organic electroluminescence device according to claim 1, wherein the plurality of spacer structures is aligned with the first electrode layer, and wherein an axis of each of the plurality of spacer structures perpendicular to the surface of the separating foil passes through the first electrode layer.

13. The organic electroluminescence device according to claim 1, wherein the separating foil is made of a foam material, and wherein the foam material comprises pores through which moisture can be transported towards the moisture-absorbing layer.

14. The organic electroluminescence device according to claim 1, wherein the plurality of spacer structures are aligned with emissive areas of the layer of organic electroluminescence material, the first electrode layer and the layer of organic electroluminescence material each being a continuous layer.

15. The organic electroluminescence device according to claim 1, wherein a surface dimension of the surface of the separating foil is larger than a surface dimension of the surface of the second electrode layer.

16. An organic electroluminescence device comprising:
a substrate;
a first electrode layer formed on the substrate;
a layer of organic electroluminescence material formed on the first electrode layer;
a second electrode layer formed on the layer of organic electroluminescence material;
a cover layer being positioned on a side of the second electrode layer that faces away from the layer of organic electroluminescence material;
a moisture-absorbing layer; and
a separating foil of resilient material, said separating foil being positioned between the second electrode layer and the moisture-absorbing layer; and
a plurality of spacer structures, said plurality of spacer structures being positioned between the separating foil, and at least one of the moisture-absorbing layer or the cover layer,
wherein the plurality of spacer structures are primarily composed of a cured adhesive material, and
wherein a contact ratio is between 5% and 20%, the contact ratio being a total surface area of the separating foil covered by the plurality of spacer structures divided by a total surface area of the separating foil.

* * * * *